Oct. 8, 1968 M. H. HANES ET AL 3,405,029

BONDING TRANSDUCERS TO DELAY LINES

Filed May 19, 1967

INVENTORS: M. H. HANES
G. E. HELMKE
BY
ATTORNEY

United States Patent Office 3,405,029

Patented Oct. 8, 1968

3,405,029

BONDING TRANSDUCERS TO DELAY LINES

Maurice H. Hanes, Warren, and George E. Helmke, Bernards Township, Somerset, N.J., assignors to Bell Telephone Laboratories, Incorporated, Murray Hill, N.J., a corporation of New York Filed May 19, 1967, Ser. No. 639,908

2 Claims. (Cl. 161—165)

ABSTRACT OF THE DISCLOSURE

The disclosure is directed to a method for bonding transducers such as quartz to ultrasonic delay media such as quartz, fused silica or glass. The adhesive is an epoxy resin with a specific curing agent applied in a manner so as to provide bond thicknesses of less than one micron.

This invention relates to methods for bonding electromechanical transducers to ultrasonic delay lines.

Recent interest in high frequency delay lines operating in the range from 20 mc. to 100 mc. has emphasized the need for more effective bonding of electromechanical transducers to delay line materials. The design of delay lines in terms of the bonding requirements between the transducer and delay medium can be approached in two alternative ways. The bonding material can be chosen to provide a minimum of acoustic impedance mismatch as described for instance in application Ser. No. 539,011, filed Mar. 31, 1966 by J. T. Krause and W. R. Northover. Alternatively, losses through impedance mismatch are small enough to be ignored if the bonding thickness is below 0.01 acoustic wavelengths. However, bonds meeting this thickness requirement and having the requisite long term stability cannot easily be produced with conventional transducer bonding adhesives. In accordance with this invention an epoxy resin adhesive bond can be made using a prescribed resin and hardener and following a specific bonding method to form a reliable, stable, bond meeting the aforementioned thickness requirement. This epoxy resin gives excellent adhesion, cohesion, chemical stability and does not evolve gases or vapors which would cause voids in the bond. It also has a low shrinkage on curing, a relatively low coefficient of thermal expansion, and low viscosity. The high rigidity of the cured resin results in higher acoustic impedance than with most other organic adhesives.

Most commercial epoxy resins contain high molecular weight analogs of the basic resin. The presence of these high molecular weight ingredients (usually more than twice the molecular weight of the basic resin) increases the viscosity of the resin beyond the limit tolerable for the specific purpose of this invention. Commonly available resins are usually further modified by the addition of inert or reactive diluents to decrease the viscosity, plasticizers and flexibilizers to increase impact strength, or solid filler materials to decrease shrinkage and to promote easier handling. All of these modifications, however, impair some characteristic of the epoxy that is important in acoustic bonds.

According to this invention a pure epoxy resin, diglycidyl ether of Bisphenol-A, is used in combination with phenylenediamine as a curing agent. The resin has the following structural formula:

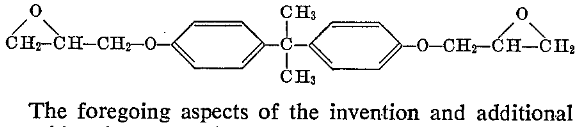

The foregoing aspects of the invention and additional considerations are discussed fully in the following detailed description. In the drawing.

Figure 1:
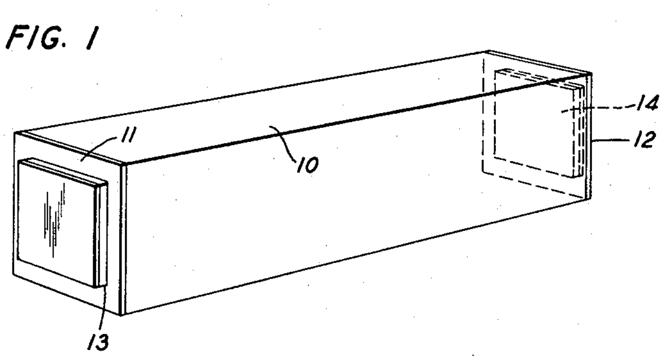
FIG. 1 is a perspective view of an exemplary delay line structure which can be fabricated using the method of this invention.

A typical delay line is shown in FIG. 1. The delay medium 10 is a conventional high quality acoustic material such as quartz, fused silica or one of several known delay line glasses. The end faces 11 and 12 of the delay line are conventionally coated with a conductive film such as silver, gold, aluminum, chromium, nickel, etc. The transducers 13 and 14 are conventional piezoelectric transducers made of quartz, zinc oxide, barium titanate, potassium-sodium niobate, one of several known ceramics, or other suitable piezoelectric material. The adhesive of this invention has been found especially suitable for bonding quartz transducers to a delay medium having a nickel electrode film.

Figure 2:
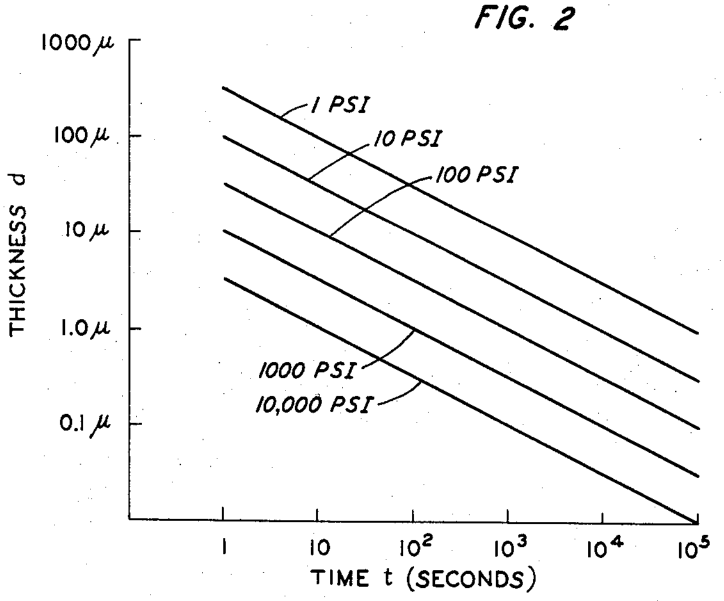
FIG. 2 is a plot of bond thickness versus time for several bonding pressures.

For the frequency range of interest in connection with this invention, 20 mc. to 100 mc., the bond thickness should be less than one micron. One problem associated with making such thin bonds is that, even when using high bonding pressures, a considerable time period is required to reach the desired bond thickness. This time period is a function of the sizes of the pieces being joined and can be expressed by the following formula:

$$t=1.09\cdot10^{-5}\frac{\eta r^2}{p}\left(\frac{1}{d^2}\right)$$

where $t$ is the time in seconds, $\eta$ is the viscosity in poise, $r$ is the radius in centimeters of the surfaces being joined (which for the purpose of this consideration are circular), $d$ is the thickness of the bond and $p$ is the pressure in pounds per square inch applied to the bonding surfaces. This relationship is illustrated in FIG. 2 which plots $t$ versus $d$ for several bonding pressures, $p$. The viscosity $\eta$ is chosen at 100 poises. Assume a bond thickness of $0.3\mu$ is required for a 75 mc. delay line. Arbitrarily choosing a pressure, $p$, of 100 p.s.i. it is seen that approximately six hours will be required to achieve the desired bond thickness. It will be appreciated that this time period exceeds the pot life of many adhesives. The problem becomes even more acute with the realization that the viscosity of the adhesive, which has assumed to constant at 100 poises over the entire sixs hours, actually begins to increase a few minutes after application. In view of these factors the relationship between the viscosity of the adhesive and the pressure applied, for making bonds of these dimensions, is critical.

Figure 3:
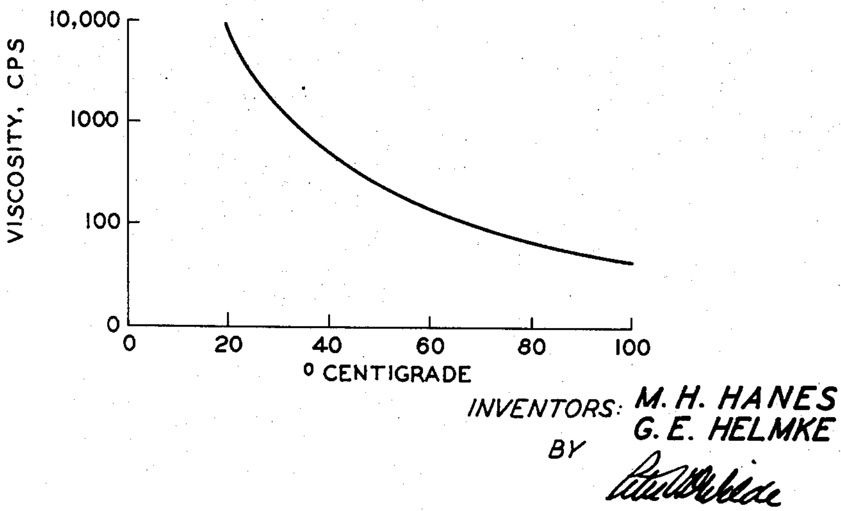
FIG. 3 is a plot of viscosity in centipoise versus temperature for the adhesive used in the method of this invention.

The viscosity of the epoxy adhesive used for this invention is shown plotted versus temperature in FIG. 3. Since the viscosity should be less than 500 centipoises for the reasons discussed above, the adhesive should be heated to a temperature of at least 50° C. The temperature should not exceed 80° C. otherwise the stresses arising due to differential thermal contraction on cooling become too severe. The pressure required to make satisfactory bonds less than one micron in thickness will generally exceed 500 p.s.i. It should be appreciated that at the elevated temperature the epoxy cures more quickly. However, the elevated temperature is essential to provide the necessary low viscosity. The epoxy-hardener combination of this invention was the most effective adhesive found in terms of the delicate balance between low viscosity and adequate pot life.

The following specific procedure was followed in making thin ($<\mu$) bonds using pure diglycidyl ether of Bisphenol-A-cured with phenylenediamine.

Pure diglycidyl ether of Bisphenol-A and m-phenylenediamine are measured and combined in a weight ratio of 100 parts resin to 15.5 parts hardener. This ratio should be maintained within the range 100:10 to 100:20 to effect proper curing. The mixture is warmed to 50° C., thoroughly stirred for at least five minutes and filtered and degassed. A useful method for filtering and applying epoxy adhesives is described and claimed in application Serial No. 605,690, filed December 29, 1966, by G. E. Helmke.

The adhesion of epoxy to surfaces is improved by careful surface preparation. To remove traces of oils and waxes a three-stage solvent wash with trichloroethylene, alcohol and acetone is effective. Chromic acid-sulfuric acid glass cleaning solution is an effective cleaner that has been used on Y-cut quartz transducers including those having vapor-plated gold surfaces. For a nickel-plated surface a mixed acid (nitric, sulfuric, phosphoric and acetic) provides an effective surface conditioner. If the surface plate is thin (less than 1000 A.), the mixed acid is preferably diluted with alcohol to avoid excessive etching.

After cleaning, the surface is rinsed with high-purity (0.2 micromho conductivity or better), filtered, deionized water followed by a drying operation consisting of blowing dry with filtered nitrogen or warming in a controlled, clean environment.

The bond is made by placing a quantity of adhesive on one surface and pressing the surfaces together at a pressure of at least 500 p.s.i. The assembly should be maintained at a temperature of at least 50° C. for at least six hours to effect curing. Bonds made using this procedure have been found to be extremely effective from the point of view of the acoustic properties of the delay line.

Various additional modifications and extensions of this invention will become apparent to those skilled in the art. All such variations and deviations which basically rely on the teachings through which this invention has advanced the art are properly considered within the spirit and scope of this invention.

What is claimed is:

1. A method for bonding a piezoelectric transducer medium selected from the group consisting of quartz, zinc oxide, barium titanate and potassium-sodium niobate to an electrically conductive metal film delay medium with a bond thickness of less than one micron comprising the steps of applying a filtered and degassed mixture consisting of the glycidyl ether of Bisphenol-A and m-phenylenediamine in a weight ratio in the range 100:10 to 100:20 to at least one of the surfaces to be bonded and pressing the surfaces to be bonded together with a pressure of at least 500 p.s.i. for a period of at least six hours while heating and maintaining the mixture at a temperature of at least 50° C.

2. An ultrasonic delay line comprising a delay medium having an electrically conductive metal film and an electromechanical transducer selected from the group consisting of quartz, zinc oxide, barium titanate and potassium-sodium niobate bonded to the metal film, the bond consisting of a filtered and degassed polymer of the diglycidyl ether of Bisphenol-A and having a thickness of less than one micron.

References Cited

UNITED STATES PATENTS 3,075,871 1/1963 Barlet ______________ 161—185

ROBERT F. BURNETT, *Primary Examiner.*

W. J. VAN BALEN, *Assistant Examiner.*